(12) United States Patent
Nakatani

(10) Patent No.: US 8,269,347 B2
(45) Date of Patent: Sep. 18, 2012

(54) SEMICONDUCTOR CHIP, ELECTRODE STRUCTURE THEREFOR AND METHOD FOR FORMING SAME

(75) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/095,193

(22) Filed: Apr. 27, 2011

(65) Prior Publication Data

US 2011/0198750 A1 Aug. 18, 2011

Related U.S. Application Data

(62) Division of application No. 11/794,243, filed on Jun. 27, 2007, now Pat. No. 7,956,460.

(30) Foreign Application Priority Data

Dec. 28, 2004 (JP) ................................ 2004-381363
Apr. 27, 2005 (JP) ................................ 2005-129000

(51) Int. Cl.
*H01L 23/48* (2006.01)
*H01L 21/44* (2006.01)

(52) U.S. Cl. ................ 257/737; 257/751; 257/E21.508; 257/E23.021; 438/613; 438/627; 438/639

(58) Field of Classification Search .................. 257/737, 257/738, 751, E21.508, E21.509, E23.021; 438/613, 614, 627, 639
See application file for complete search history.

(56) References Cited

U.S. PATENT DOCUMENTS

| | | | |
|---|---|---|---|
| 5,449,955 A | 9/1995 | Debiec et al. | |
| 6,337,245 B1 | 1/2002 | Choi | |
| 6,350,677 B1 | 2/2002 | Ko et al. | |
| 6,433,429 B1 | 8/2002 | Stamper | |
| 6,458,609 B1 | 10/2002 | Hikita et al. | |
| 6,495,005 B1 * | 12/2002 | Colgan et al. | 204/224 R |
| 6,734,568 B2 * | 5/2004 | Matsuo et al. | 257/781 |
| 7,067,423 B2 | 6/2006 | Ohara | |
| 7,145,235 B2 * | 12/2006 | Bohr | 257/734 |
| 2002/0037643 A1 | 3/2002 | Ishimaru | |
| 2002/0149117 A1 | 10/2002 | Shibata | |
| 2003/0207499 A1 | 11/2003 | DiStefano et al. | |
| 2005/0098605 A1 * | 5/2005 | Edelstein et al. | 228/4.5 |

FOREIGN PATENT DOCUMENTS

| | | |
|---|---|---|
| CN | 1286497 A | 3/2001 |
| JP | 04-065832 | 3/1992 |
| JP | 4-266037 | 9/1992 |
| JP | 05-062979 | 3/1993 |
| JP | 8-88307 | 4/1996 |
| JP | 2000-188305 | 7/2000 |
| JP | 2000-306949 | 11/2000 |
| JP | 2000-340595 | 12/2000 |
| JP | 2003-201574 A | 7/2003 |
| JP | 2003-297868 | 10/2003 |

* cited by examiner

*Primary Examiner* — Tuan N. Quach

(74) *Attorney, Agent, or Firm* — Rabin & Berdo, P.C.

(57) ABSTRACT

A semiconductor chip, an electrode structure and a method of manufacture, the chip including a semiconductor substrate having a multi-level interconnection and an electrode pad connected to the interconnection, a protective film on the substrate, an insulating film on the protective film, a bump of a metal on the electrode pad, and a barrier layer between the side of the bump and the insulation film.

22 Claims, 6 Drawing Sheets

SEMICONDUCTOR CHIP, ELECTRODE STRUCTURE THEREFOR AND METHOD FOR FORMING SAME

CROSS-REFERENCE TO RELATED APPLICATIONS

This application is a division of application Ser. No. 11/794,243, filed on Jun. 27, 2007, now issued as U.S. Pat. No. 7,956,460. Furthermore, this application claims the benefit of priority of Japanese applications 2004-381363, filed Dec. 28, 2004 and 2005-129000, filed Apr. 27, 2005. The disclosure of Japanese application 2004-381363 is incorporated herein by reference.

BACKGROUND OF THE INVENTION

1. Field of the Invention

The present invention relates to a semiconductor chip and a production method therefor, an electrode structure provided in the semiconductor chip and a formation method therefor, and a semiconductor device having a chip-on-chip structure or a flip chip bonding structure.

2. Description of the Related Art

A known method for connecting a semiconductor chip to a wiring board (mounting board) in a semiconductor device such as an IC or an LSI is to bond bumps provided on a surface of the semiconductor chip to terminals of the wiring board.

In recent years, there has been a demand for further microminiaturization of the semiconductor chip for size reduction of electronic apparatuses typified by mobile phones and PDA (personal digital assistants). With the microminiaturization of the semiconductor chip, the pitch of the bumps on the surface of the semiconductor chip is reduced to about 10 µm.

Further, known examples of a structure designed for size reduction and higher density integration of the semiconductor device include a chip-on-chip structure in which a semiconductor chip is bonded to a second semiconductor chip in face-to-face relation, and a flip chip bonding structure in which a semiconductor chip is bonded to a wiring board with its front surface being opposed to the wiring board.

In the semiconductor device having such a structure, bumps composed of a metal such as gold (Au) are provided on the surface of the semiconductor chip. The bumps are connected to bumps provided on the surface of the second semiconductor chip or electrode pads provided on the surface of the wiring board, whereby the semiconductor chip is bonded to the second semiconductor chip or the wiring board in predetermined spaced relation. In the bonding, an ACF (anisotropic conductive film) is interposed between the semiconductor chips or between the semiconductor chip and the wiring board. Thus, a space between the semiconductor chips or between the semiconductor chip and the wiring board is sealed with the ACF. Further, electrically conductive capsules contained in parts of the ACF present in junctures of the bumps are collapsed, whereby electrical connection between the bumps or between the bumps and the electrode pads is properly established.

Patent document 1: Japanese Unexamined Patent Publication No. 2003-297868

Patent document 2: Japanese Unexamined Patent Publication No. 2000-340595

BRIEF SUMMARY OF THE INVENTION

However, the metal as a material for the bumps (a metal constituent contained in the bumps) is liable to migrate, so that the reduction of the pitch of the bumps may lead to short circuit between the bumps due to the migration. Therefore, a technique for suppressing the short circuit between the bumps is essential for the further microminiaturization of the semiconductor chip.

It is therefore an object of the present invention to provide a semiconductor chip and a production method therefor, a semiconductor chip electrode structure and a formation method therefor, and a semiconductor device, which prevent the inter-bump short circuit which may otherwise occur due to the migration of the metal of the bumps.

According to one aspect of the present invention, a semiconductor chip comprises a semiconductor substrate, a bump of a metal projecting from a surface of the semiconductor substrate, and an alloy film covering an entire surface of the bump (an entire surface of the bump exposed from the surface of the semiconductor substrate), the alloy film being composed of an alloy of the metal of the bump and a second metal.

With this arrangement, the surface of the metal bump is covered with the alloy film. This prevents a phenomenon (migration) such that, when the semiconductor chip is bonded to a surface of a solid device such as a second semiconductor chip or a wiring board with the intervention of a resin layer, atoms of the metal of the bump (a metal constituent contained in the bump) migrate into the resin layer. Therefore, the inter-bump short circuit can be prevented which may otherwise occur due to that phenomenon.

The metal of the bump may be a single element metal such as gold (Au) or copper (Cu), or may be a multi-element metal material such as solder (e.g., Sn—Pb solder).

Where the bump is composed of gold, the alloy film is preferably composed of an alloy of gold with titanium, aluminum, nickel or cobalt.

In this case, the alloy film can be reliably and easily formed.

According to another aspect of the present invention, a semiconductor chip production method comprises the steps of: forming a bump of a metal material projecting from a surface of a substrate; forming a metal film over an entire surface of the semiconductor substrate formed with the bump, the metal film being composed of a second metal which is alloyable with the metal of the bump; heat-treating the resulting semiconductor substrate after the metal film forming step to alloy the metal of the bump with the metal of the metal film; and removing an unalloyed portion of the metal film by etching after the alloying step.

In this method, the metal film is formed over the entire surface of the semiconductor substrate formed with the bump, and then the resulting semiconductor substrate is heat-treated. Thus, a portion of the metal film in contact with the surface of the bump is alloyed into the alloy film by mutual diffusion of the metal of the bump and the metal of the metal film. After the heat treatment, the unalloyed portion of the metal film, i.e., a portion of the metal film except the alloyed film portion, is etched away, whereby a semiconductor chip can be reliably and easily provided which has the bump covered with the alloy film.

According to further another aspect of the present invention, a semiconductor chip comprises a substrate including a multilevel interconnection, an electrode pad provided on a surface of the substrate and connected to the multilevel interconnection, a protective film covering a portion of the substrate around the electrode pad, an insulation film provided on the protective film, a bump of a metal having a bottom surface disposed on the electrode pad and a side wall surrounded by the insulation film, and a barrier layer provided between the side wall of the bump and the insulation film.

With this arrangement, the barrier layer is provided between the side wall of the bump and the insulation film. Therefore, a metal constituent contained in the bump is prevented from migrating into the insulation film, whereby short circuit between adjacent bumps is prevented. This improves the operational reliability of the semiconductor chip, and allows for the microminiaturization of the semiconductor chip.

In the semiconductor chip according to this aspect, the bump may be composed of gold, and the barrier layer may be composed of at least one metal or alloy selected from the group consisting of Ti, W, Si, Ni, Co, Al, TiW and NiCo.

According to still another aspect of the present invention, a semiconductor chip electrode structure comprises an electrode pad provided on a surface of a substrate including a multilevel interconnection and connected to the multilevel interconnection, a protective film covering a portion of the substrate around the electrode pad, an insulation film provided on the protective film, a bump of a metal having a bottom surface disposed on the electrode pad and a side wall surrounded by the insulation film, and a barrier layer provided between the side wall of the bump and the insulation film.

With this arrangement, the barrier layer is provided between the side wall of the bump and the insulation film. Therefore, a metal constituent contained in the bump is prevented from migrating into the insulation film, whereby short circuit between adjacent bumps is prevented. This improves the operational reliability of the semiconductor chip, and allows for the microminiaturization of the semiconductor chip.

In the electrode structure according to this aspect, the bump may be composed of gold, and the barrier layer may be composed of at least one metal or alloy selected from the group consisting of Ti, W, Si, Ni, Co, Al, TiW and NiCo.

According to further another aspect of the present invention, a semiconductor chip electrode structure formation method comprises the steps of: forming an electrode pad on a surface of a substrate including a multilevel interconnection so as to connect the electrode pad to the multilevel interconnection, and then covering a portion of the substrate around the electrode pad with a protective film; forming a metal bump on the electrode pad; cove ring exposed surfaces of the bump and the electrode pad with a barrier layer; selectively removing a portion of the barrier layer except that formed on a side surface of the bump; and forming an insulation film on the protective film so as to expose an upper surface of the bump.

By this method, the semiconductor chip electrode structure according to the aforesaid aspect can be produced.

In the method according to this aspect, the bump may be composed of gold, and the barrier layer may be composed of at least one metal or alloy selected from the group consisting of Ti, W, Si, Ni, Co, Al, TiW and NiCo.

According to still another aspect of the present invention, a semiconductor device comprises a solid device, and a semiconductor chip bonded to a surface of the solid device, wherein the semiconductor chip is any of the aforementioned semiconductor chips.

This arrangement makes it possible to prevent a phenomenon (migration) such that metal atoms contained in the metal material of the bump migrate into the resin layer, when the resin layer is interposed between the semiconductor chip and the solid device. Therefore, the inter-bump short circuit is prevented which may otherwise occur due to that phenomenon.

The semiconductor device preferably further comprises an anisotropic conductive film interposed between the semiconductor chip and the solid device.

With this arrangement, electrical connection between the semiconductor chip and the solid device is properly established. Further, it is possible to prevent a phenomenon (migration) such that the metal atoms contained in the metal material of the bump migrate into the anisotropic conductive film as the resin layer. Therefore, the inter-bump short circuit is prevented which may otherwise occur due to that phenomenon.

The foregoing and other objects, features and effects of the present invention will become more apparent from the following detailed description of the embodiments with reference to the attached drawings.

DETAILED DESCRIPTION OF THE INVENTION

Embodiments of the present invention will hereinafter be described in detail with reference to the attached drawings.

Figure 1:
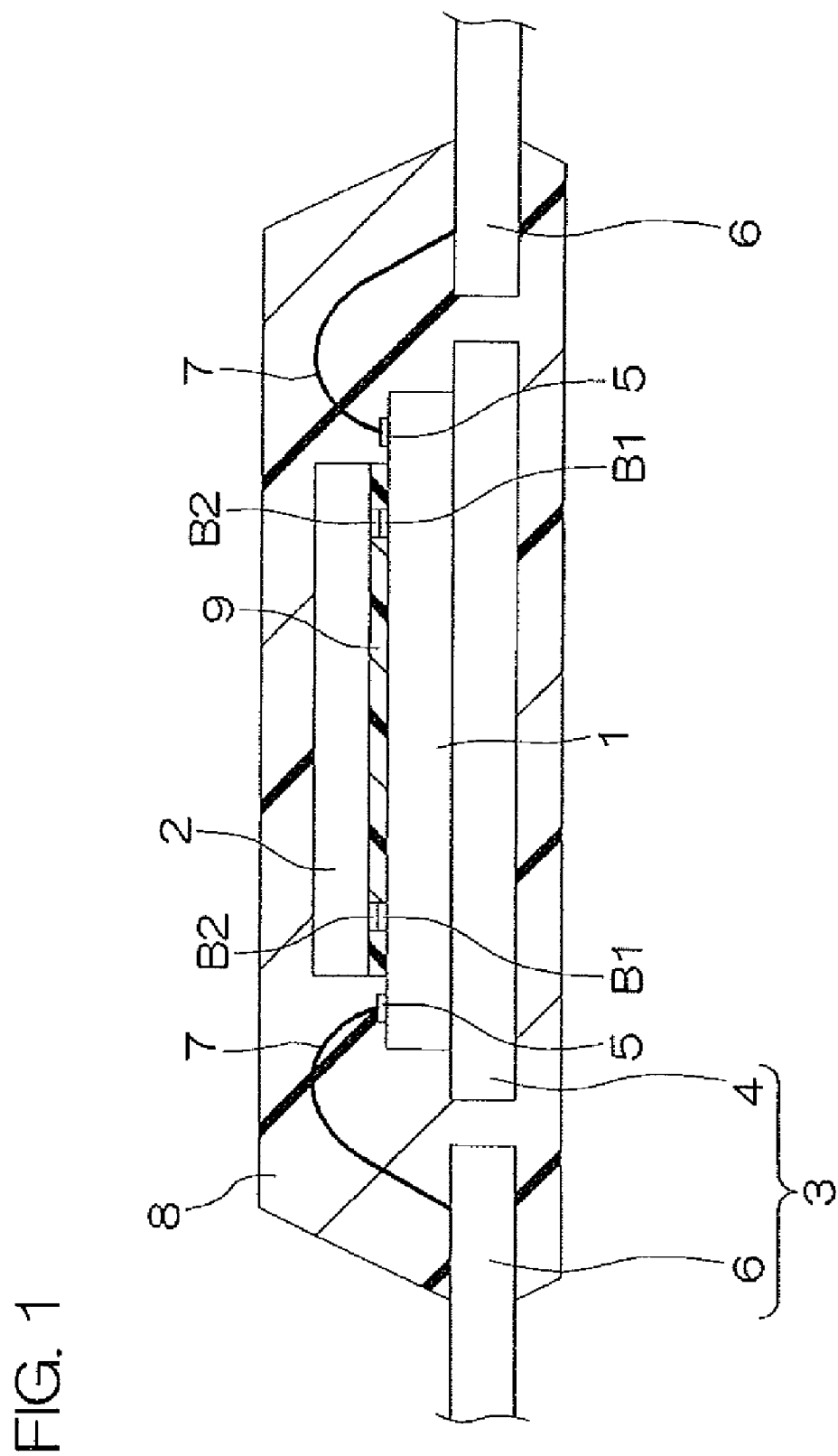
[FIG. 1] A schematic sectional view for explaining the construction of a semiconductor device according to one embodiment of the present invention.

FIG. 1 is a schematic sectional view for explaining the construction of a semiconductor device according to one embodiment of the present invention. The semiconductor device has a so-called chip-on-chip structure, in which a secondary chip 2 is bonded onto a primary chip 1.

The primary chip 1 and the secondary chip 2 are each a semiconductor chip (e.g., a silicon chip). The primary chip 1 and the secondary chip 2 are bonded to each other in face-to-face relation with an active surface of the primary chip 1 (on the side of the surface of an active region formed with a device) being opposed to an active surface of the secondary chip 2. More specifically, the primary chip 1 is die-bonded to an island portion 4 of a lead frame 3 with its active surface facing up. The secondary chip 2 is bonded to the upper surface of the primary chip 1 with its face down.

The primary chip 1 has external connection pads 5 provided on a peripheral portion of the active surface thereof. The pads 5 are electrically connected to lead portions 6 of the lead frame 3 via bonding wires 7. Further, the primary chip 1, the secondary chip 2, the lead frame 3 and the bonding wires 7 are sealed in a sealing resin 8 to provide a semiconductor package. Parts of the lead portions 6 are exposed from the sealing resin 8 to function as external connection portions (outer lead portions).

The primary chip 1 and the secondary chip 2 each includes a plurality of bumps B1, B2 provided on the active surface thereof. The bumps B1 of the primary chip 1 are respectively bonded to the bumps B2 of the secondary chip 2 with top surfaces of the bumps B1 respectively abutting with top surfaces of the bumps B2. Thus, the primary chip 1 and the secondary chip 2 are electrically connected to each other via the bumps B1, B2, and mechanically connected to each other in predetermined spaced relation.

When the primary chip 1 and the secondary chip 2 are bonded to each other, an ACF (anisotropic conductive film) 9 is interposed between the active surface of the primary chip 1 and the active surface of the secondary chip 2. Thus, a space between the primary chip 1 and the secondary chip 2 is sealed with the ACF, whereby the active surfaces of the primary chip 1 and the secondary chip are protected. In addition, electrically conductive capsules contained in parts of the ACF 9 present in junctures between the bumps B1 of the primary chip 1 and the bumps B2 of the secondary chip 2 are collapsed to exhibit an electrically conductive property. Thus, electrical connection between the bumps B1 and the bumps B2 is properly established.

Figure 2:
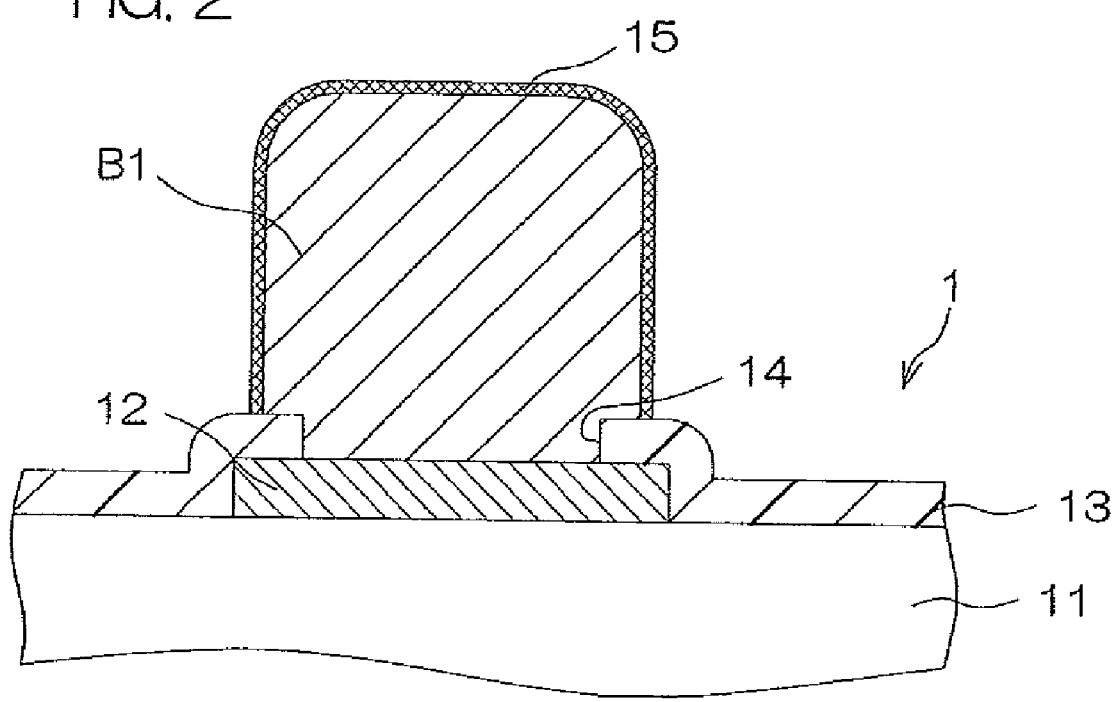
[FIG. 2] A schematic sectional view for explaining in detail the construction of a bump provided on a primary chip (semiconductor chip) of the semiconductor device shown in FIG. 1.

FIG. 2 is a schematic sectional view for explaining in detail the construction of each of the bumps B1 provided on the primary chip 1. A multilevel interconnection structure, for example, is provided in a surface of a semiconductor substrate (e.g., a silicon substrate) 11 defined as a base of the primary chip 1. An uppermost interconnection layer 12 is partly exposed as pads from openings 14 formed in a surface protective film 13. The bumps B1, which are composed of gold (Au), respectively cover the openings 14 and project from the surface protective film 13.

An alloy film 15 composed of an alloy of titanium (Ti) and gold which is the material for the bumps B1 is provided on the entire surface of each of the bumps B1. In other words, a top surface and a side surface of the bump B1 exposed from the surface protective film 13 are entirely covered with the alloy film 15 which is composed of the alloy (Au—Ti) of titanium (Ti) and gold which is the material for the bumps B1.

Though not shown, like the bumps B1 of the primary chip 1, the bumps B2 provided on the secondary chip 2 are composed of gold (Au) and project from a surface protective film covering an uppermost surface of the secondary chip 2, and a surface of each of the bumps B2 exposed from the surface protective film is entirely covered with an alloy film composed of a gold-titanium alloy.

With the aforesaid arrangement, the surfaces of the gold bumps B1, B2 are each covered with the alloy film 15 composed of the gold-titanium alloy. This prevents a phenomenon (migration) such that gold atoms in the bumps B1, B2 migrate into the resin of the ACF 9. Therefore, short circuit between adjacent ones of the bumps B1 on the surface of the primary chip 1, between adjacent ones of the bumps B2 on the surface of the secondary chip 2 and between unconnected ones of the bumps B1 and B2 is prevented, which may otherwise occur due to the migration.

Figure 3:
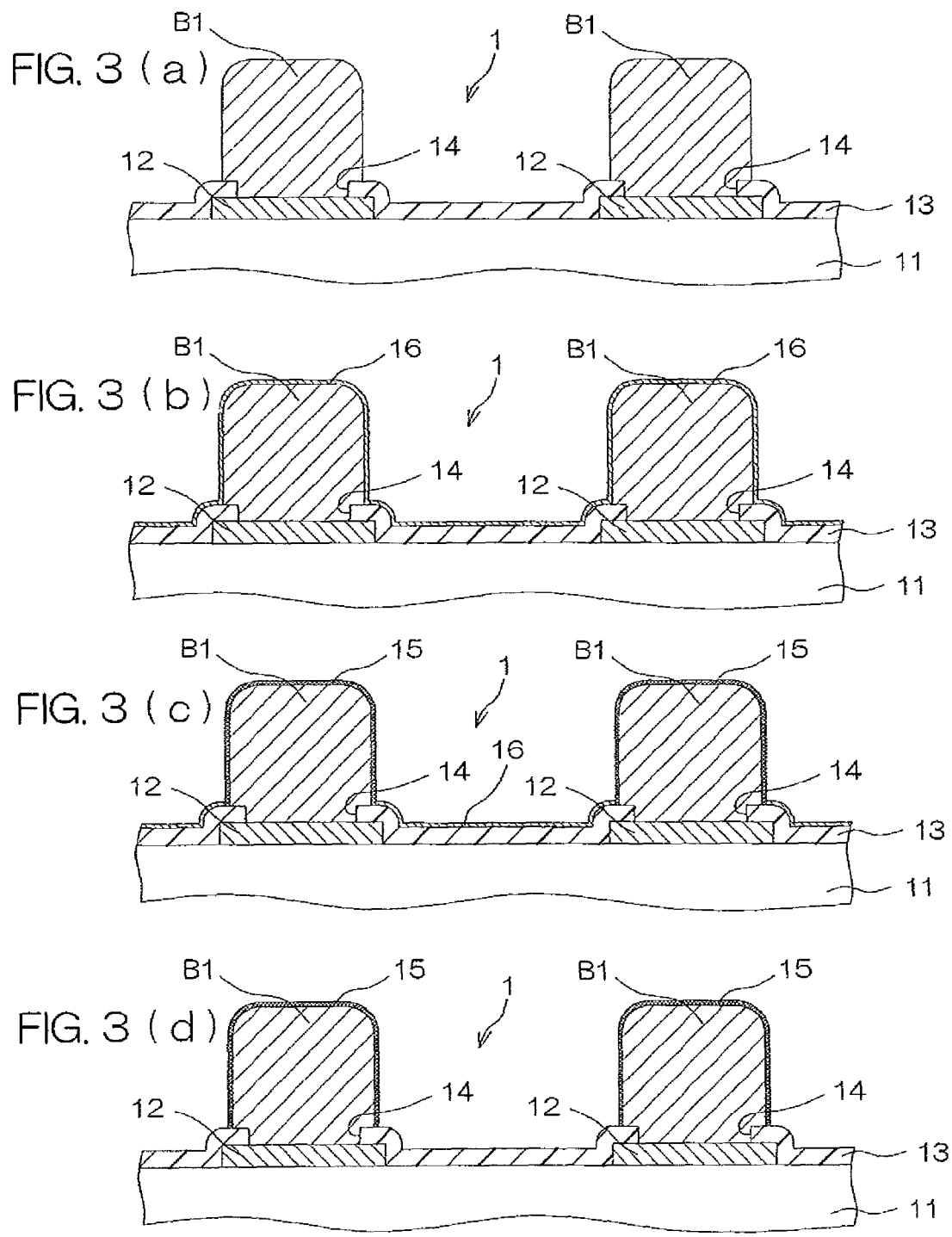
FIGS. 3(a)-3(d) Schematic sectional views illustrating the sequential steps of a process for producing the primary chip.

3(a)-3(d) are is schematic sectional views illustrating the sequential steps of a process for producing the primary chip 1. As shown in FIG. 3(a), openings 14 are formed in a surface protective film 13 covering a surface of a semiconductor substrate 11 provided in a wafer form to partly expose an interconnection layer 12 as pads, and then bumps B1 are formed, for example, by a gold plating process (bump forming step).

In turn, as shown in FIG. 3(b), a titanium film 16 is formed over the entire surface of the semiconductor substrate 11 formed with the bumps B1 (including entire surfaces of the surface protective film 13 and the bumps B1), for example, by a vapor deposition method such as a sputtering method or a CVD (chemical vapor deposition) method (metal film forming step).

Then, the semiconductor substrate 11 having the titanium film 16 formed on the entire outermost surface thereof is loaded in a heat treatment apparatus such as a rapid thermal annealing device or a diffusion oven, and heated (heat-treated) at a temperature of 100 to 400° C. for a period of several seconds to several tens minutes. Through the heat treatment, portions of the titanium film 16 in contact with the surfaces of the bumps B1 are alloyed into alloy films 15 by mutual diffusion of gold of the bumps B1 and titanium of the titanium film 16 as shown in FIG. 3(c) (alloying step).

Thereafter, an etching liquid which is capable of properly etching titanium but is incapable of etching the gold-titanium alloy, i.e., an etching liquid containing at least a hydrogen peroxide solution or sulfuric acid, is supplied to the surface of the semiconductor substrate 11 formed with the alloy films 15 and the titanium film 16. Thus, the titanium film 16 is etched away and the alloy films 15 are left unetched, whereby the primary chip 1 is provided as having the bumps B1 respectively covered with the alloy films 15 as shown in FIG. 3(d).

Such production process makes it possible to reliably and easily produce the primary chip 1 having the bumps B1 respectively covered with the alloy films 15.

The secondary chip 2 is produced in the same manner as the primary chip 1.

In this embodiment, the alloy films 15 respectively covering the entire surfaces of the bumps B1, B2 are composed of the gold-titanium alloy. However, alloy films composed of an alloy of gold and a metal other than titanium may be formed on the surfaces of the respective bumps by forming a film of the metal other than titanium over the surface of the semiconductor substrate and then performing the heat treatment. That is, the metal film to be formed over the surface of the semiconductor substrate may be a film of a metal material alloyable with gold. For example, alloy films composed of an alloy of gold with aluminum (Al), nickel (Ni) or cobalt (Co) may be formed by forming a metal film of aluminum, nickel or cobalt over the surface of the semiconductor substrate and then performing the heat treatment. Further, the alloy for the alloy films is not limited to the alloys of two types of metals including gold, but may be an alloy of three or more types of metals including gold.

The metal material for the bumps is not limited to gold, but may be copper (Cu). Further, the metal material for the bumps is not limited to a single element material such as gold or copper, but may be a multi-element material such as solder (e.g., Sn—Pb solder). Where the bumps are composed of the solder, migration of metal atoms contained in the solder can be prevented by forming alloy films of an alloy of the solder on the surfaces of the bumps.

Figure 4:
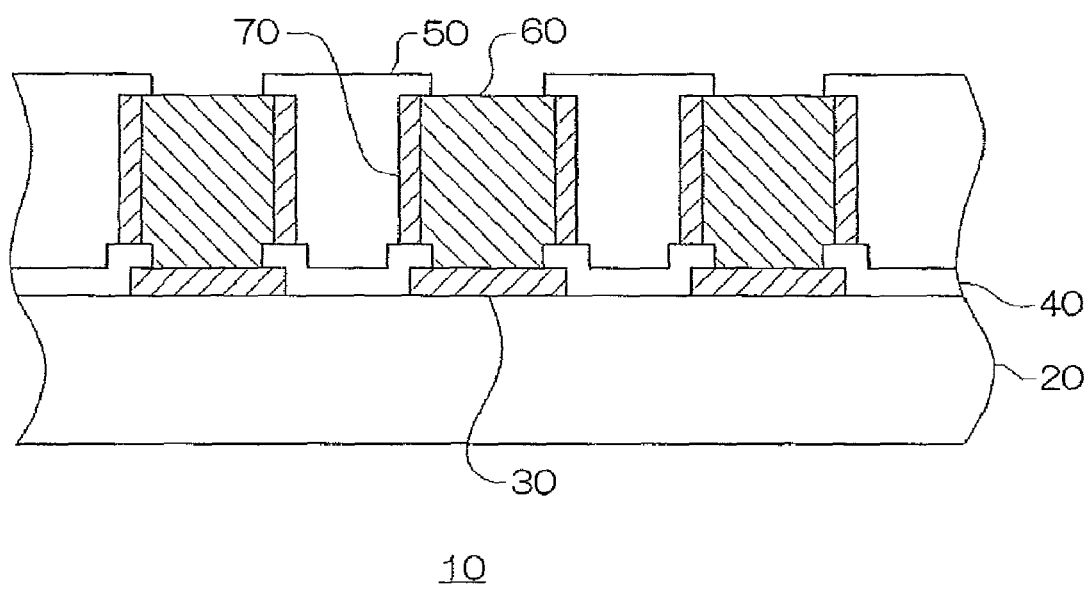
[FIG. 4] A sectional view of an electrode structure provided in a semiconductor chip according to another embodiment of the present invention.

FIG. 4 is a sectional view of an electrode structure provided in a semiconductor chip according to another embodiment of the present invention.

The semiconductor chip 10 includes a substrate 20 of silicon or the like formed with a semiconductor integrated circuit (not shown). The substrate 20 includes a multilevel interconnection as an electrical interconnection of the semiconductor integrated circuit. The multilevel interconnection includes a plurality of interconnection layers and interlevel dielectric films for insulating the interconnection layers from each other.

Electrode pads 30 serving as electrode terminals of the semiconductor integrated circuit are respectively connected to parts of the multilevel interconnection in desired areas on a surface of the substrate 20. The electrode pads 30 are composed of a metal such as aluminum or an alloy such as Al—Si or Al—Si—Cu.

A portion of the substrate 20 around the electrode pads 30 is covered with a protective film 40 such as of a silicon nitride film ($Si_3N_4$ film). The protective film 40 prevents intrusion of moisture or the like from the outside.

An insulation film 50 composed of an insulative material such as polyimide is provided on the protective film 40.

Bumps 60 composed of a metal such as gold are provided on the substrate with bottom surfaces thereof disposed on the electrode pads 30 and with side walls thereof surrounded by the insulation film 50.

Barrier layers 70 are respectively provided between the side walls of the bumps 60 and the insulation film 50. The barrier layers 70 are composed of a material which is highly adhesive to the bumps 60 and the insulation film 50 and less prone to oxidation. The provision of the barrier layers 70 of the material less prone to oxidation suppresses a phenomenon (migration) such that a metal constituent of the bumps 60 migrate across the insulation film 50. Further, since the side walls of the bumps 60 are protected by the barrier layers 70, the durability of the bumps 60 is improved.

Examples of the material for the barrier layers 70 include metals and alloys such as titanium (Ti), tungsten (W), silicon (Si), nickel (Ni), cobalt (Co), aluminum (Al), titanium-tungsten (TiW) and nickel-cobalt (NiCo). Among these, silicon is alloyable with gold and, therefore, capable of effectively suppressing the migration of gold.

In the electrode structure according to this embodiment, the barrier layers 70 suppress the migration of the metal constituent of the bumps 60. As a result, the insulation between adjacent ones of the bumps 60 is improved. This allows for the microminiaturization of the semiconductor chip 10 without deteriorating the operational reliability of the semiconductor chip 10.

FIGS. 5A to 5F are schematic sectional views illustrating the sequential steps of a process for forming the electrode structure of the semiconductor chip 10.

Figure 5A:
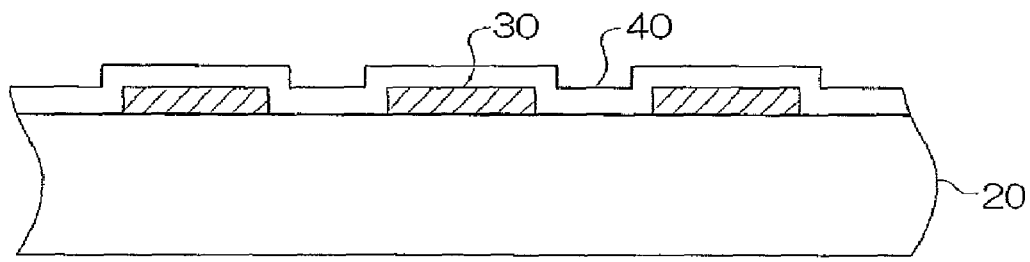
[FIG. 5A] A schematic sectional view illustrating a step of a process for forming the electrode structure.

As shown in FIG. 5A, electrode pads 30 of aluminum are first formed in predetermined areas on a substrate 20, and a protective film 40 of silicon nitride is formed on the entire surface of the resulting substrate by a plasma CVD method.

Figure 5B:
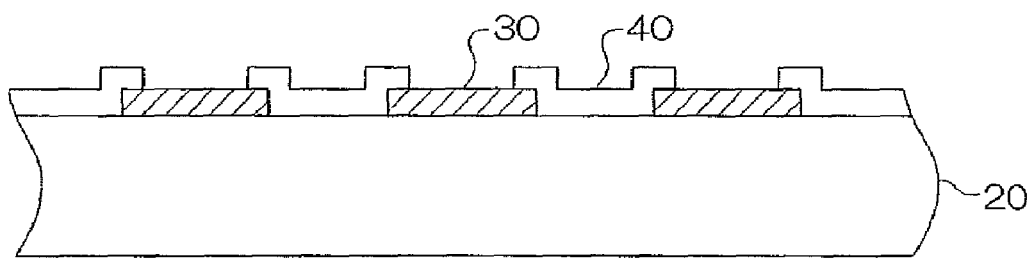
[FIG. 5B] A schematic sectional view illustrating a step subsequent to the step of FIG. 5A.

Subsequently, as shown in FIG. 5B, openings are formed in the protective film 40 on the electrode pads 30 by a photolithography method to expose surfaces of the electrode pads 30.

Figure 5C:
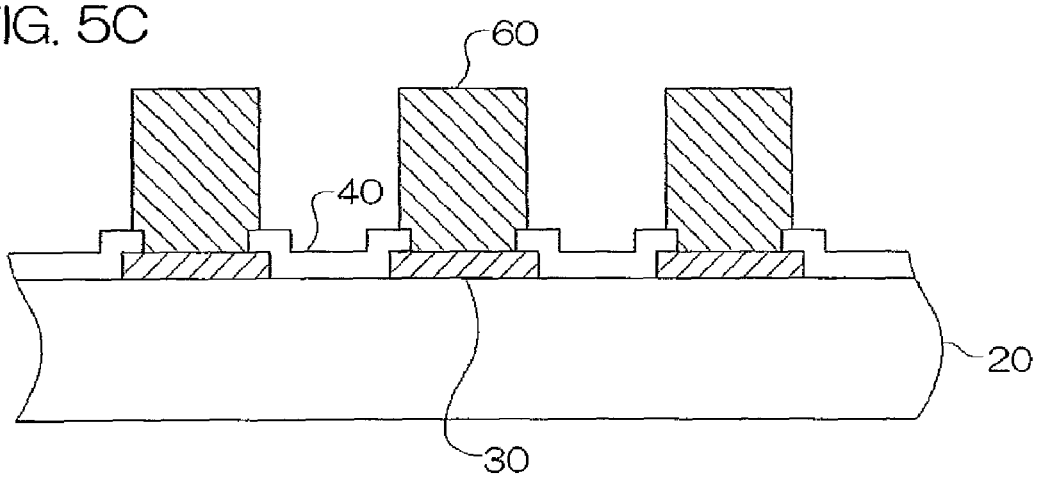
[FIG. 5C] A schematic sectional view illustrating a step subsequent to the step of FIG. 5B.

Then, as shown in FIG. 5C, bumps 60 are respectively formed on the electrode pads 30 by gold plating with the use of a photoresist (not shown) having openings on the electrode pads 30.

Figure 5D:
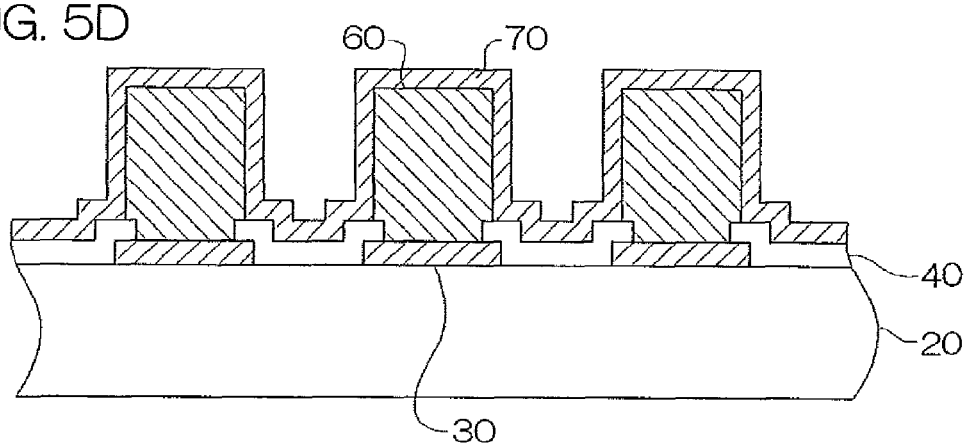
[FIG. 5D] A schematic sectional view illustrating a step subsequent to the step of FIG. 5C.

In turn, as shown in FIG. 5D, a barrier layer 70 of a metal such as titanium or aluminum is formed over the entire resulting substrate by a sputtering method, so that exposed surfaces of the bumps 60 and the electrode pads 30 are covered with the barrier layer 70. Where the barrier layer 70 has a thickness equivalent to that of a single atom layer, a migration suppressing effect can be expected. However, the barrier layer 70 preferably has a thickness of 30 to 100 nm to more assuredly provide the migration suppressing effect.

If the thickness of the barrier layer 70 is smaller than 30 nm, the capability of blocking the metal constituent of the bumps 60 is reduced, so that the migration suppressing effect is deteriorated. If the thickness of the barrier layer 70 is greater than 100 nm, the barrier layer 70 is liable to be cracked or fractured. Therefore, the barrier layer 70 has a migration path along which the metal constituent of the bump 60 migrates.

Figure 5E:
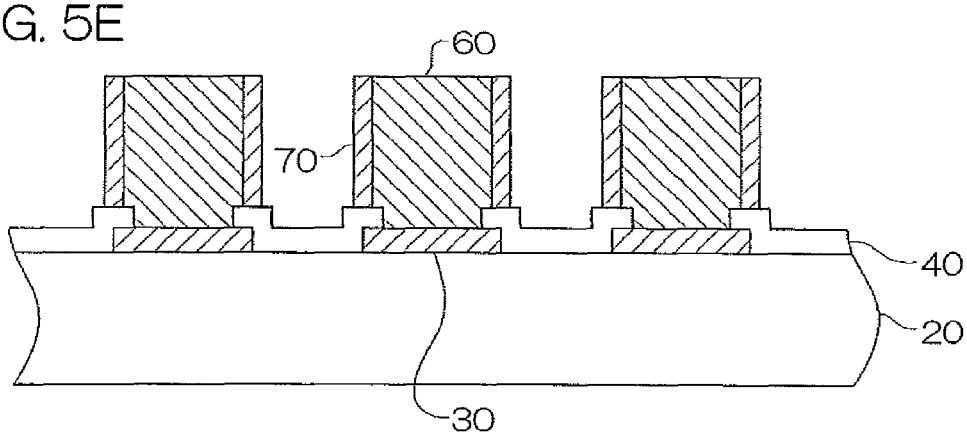
[FIG. 5E] A schematic sectional view illustrating a step subsequent to the step of FIG. 5D.

Subsequently, as shown in FIG. 5E, portions of the barrier layer 70 covering the upper surfaces of the electrode pads 30 and the bumps 60 are selectively removed by dry etching such as plasma etching, whereby portions of the barrier layer 70 covering the side surfaces of the bumps 60 remain.

Figure 5F:
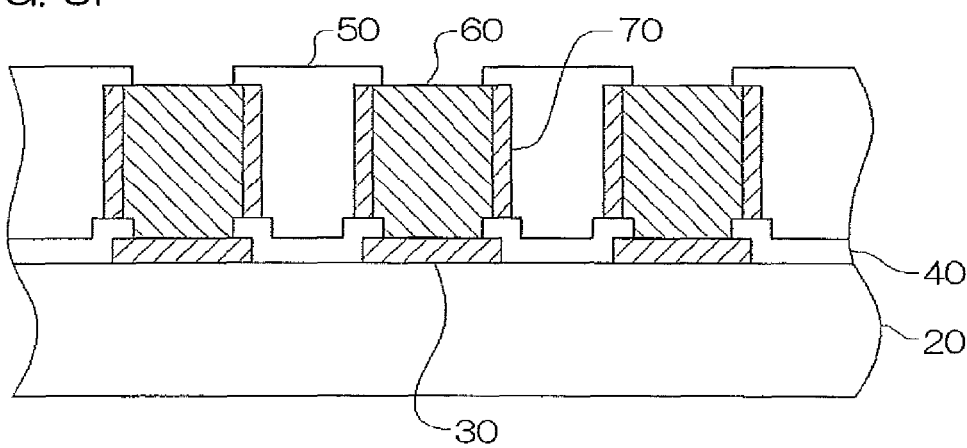
[FIG. 5F] A schematic sectional view illustrating a step subsequent to the step of FIG. 5E.

In turn, as shown in FIG. 5F, an insulation film 50 such as of polyimide is formed over the resulting substrate by sputtering, and portions of the insulation film 50 on the bumps 60 are selectively removed with the use of a photoresist (not shown) having opening on the bumps 60, whereby the upper surfaces of the bumps 60 are exposed.

Where gold is used as the material for the bumps 60, the barrier layer 70 should be formed of a metal or a metal alloy. Where a metal other than gold, e.g., copper, is used as the material for the bumps 60, the barrier layer 70 is not necessarily required to be formed of a metal, but may be formed of an organic material such as phenol resin. In this case, a CVD method is used instead of the sputtering method to cover the entire surfaces of the bumps 60 and the electrode pads 30 with the barrier layer 70.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

For example, the present invention is applicable not only to the semiconductor device of the chip-on-chip structure but also to a semiconductor chip of a flip chip bonding structure in which a semiconductor chip is bonded to a wiring board (solid device) with its front surface being opposed to the wiring board.

The semiconductor chip and the solid device (a second semiconductor chip or a wiring board) to be bonded to each other are not necessarily required to be each provided with the bumps, but the bumps may be provided on either of the semiconductor chip and the solid device. Where the semiconductor chip is bonded onto the wiring board by a flip chip bonding method, for example, bumps may be provided only on the semiconductor chip, and bonded to wiring conductors such as electrode pads provided on the wiring board.

The invention claimed is:

1. A semiconductor chip comprising:
a substrate including a multilevel interconnection;
an electrode pad provided on a surface of the substrate and connected to the multilevel interconnection;
a protective film covering a portion of the substrate around the electrode pad;
an insulation film provided on the protective film;
a bump of a metal having a bottom surface disposed on the electrode pad and a side wall surrounded by the insulation film; and
a barrier layer provided between the side wall of the bump and the insulation film,
wherein an upper end face of the barrier layer is flush with an upper surface of the bump, and the entire side wall of the bump is covered by the barrier layer,
wherein the insulation film covers the upper end face of the barrier layer and a part of the upper surface of the bump in addition to the side wall of the bump.

2. A semiconductor chip as set forth in claim 1, wherein the bump is composed of gold.

3. A semiconductor chip as set forth in claim 1, wherein the barrier layer is composed of at least one metal or alloy selected from the group consisting of Ti, W, Si, Ni, Co, Al, TiW and NiCo.

4. A semiconductor chip as set forth in claim 1, wherein the barrier layer has a thickness of 30 to 100 nm.

5. A semiconductor chip as set forth in claim 1, wherein the electrode pad is composed of aluminum or an alloy of Al—Si or Al—Si—Cu.

6. A semiconductor chip as set forth in claim 1, wherein the protective film is composed of silicon nitride.

7. A semiconductor chip as set forth in claim 1, wherein the insulation film is composed of polyimide.

8. A semiconductor chip electrode structure comprising:
   an electrode pad provided on a surface of a substrate including a multilevel interconnection and connected to the multilevel interconnection;
   a protective film covering a portion of the substrate around the electrode pad;
   an insulation film provided on the protective film;
   a bump of a metal having a bottom surface disposed on the electrode pad and a side wall surrounded by the insulation film; and
   a barrier layer provided between the side wall of the bump and the insulation film,
   wherein an upper end face of the barrier layer is flush with an upper surface of the bump, and the entire side wall of the bump is covered by the barrier layer,
   wherein the insulation film covers the upper end face of the barrier layer and a part of the upper surface of the bump in addition to the side wall of the bump.

9. A semiconductor chip electrode structure as set forth in claim 8, wherein the bump is composed of gold.

10. A semiconductor chip electrode structure as set forth in claim 8, wherein the barrier layer is composed of at least one metal or alloy selected from the group consisting of Ti, W, Si, Ni, Co, Al, TiW and NiCo.

11. A semiconductor chip electrode structure as set forth in claim 8, wherein the barrier layer has a thickness of 30 to 100 nm.

12. A semiconductor chip electrode structure as set forth in claim 8, wherein the electrode pad is composed of aluminum or an alloy of Al—Si or Al—Si—Cu.

13. A semiconductor chip electrode structure as set forth in claim 8, wherein the protective film is composed of silicon nitride.

14. A semiconductor chip electrode structure as set forth in claim 8, wherein the insulation film is composed of polyimide.

15. A semiconductor chip electrode structure formation method comprising the steps of:
   forming an electrode pad on a surface of a substrate including a multilevel interconnection so as to connect the electrode pad to the multilevel interconnection, and then covering a portion of the substrate around the electrode pad with a protective film;
   forming a metal bump on the electrode pad;
   covering exposed surfaces of the bump and the electrode pad with a barrier layer;
   selectively removing a portion of the barrier layer except that formed on a side surface of the bump so that an upper end face of the barrier layer is flush with an upper surface of the bump, and the entire side wall of the bump is covered by the barrier layer; and
   forming an insulation film on the protective film so as to expose an upper surface of the bump.

16. A semiconductor chip electrode structure formation method as set forth in claim 15, wherein gold is employed as a material for the bump.

17. A semiconductor chip electrode structure formation method as set forth in claim 15, wherein at least one metal or alloy selected from the group consisting of Ti, W, Si, Ni, Co, Al, TiW and NiCo is employed as a material for the barrier layer.

18. A semiconductor chip electrode structure formation method as set forth in claim 15, wherein the insulation film covers the upper end face of the barrier layer and a part of the upper surface of the bump in addition to the side wall of the bump.

19. A semiconductor chip electrode structure formation method as set forth in claim 15, wherein the barrier layer has a thickness of 30 to 100 nm.

20. A semiconductor chip electrode structure formation method as set forth in claim 15, wherein the electrode pad is composed of aluminum or an alloy of Al—Si or Al—Si—Cu.

21. A semiconductor chip electrode structure formation method as set forth in claim 15, wherein the protective film is composed of silicon nitride.

22. A semiconductor chip electrode structure formation method as set forth in claim 15, wherein the insulation film is composed of polyimide.

* * * * *